(12) United States Patent
Scheifers et al.

(10) Patent No.: US 6,562,663 B2
(45) Date of Patent: May 13, 2003

(54) MICROELECTRONIC ASSEMBLY WITH DIE SUPPORT AND METHOD

(75) Inventors: Steven M. Scheifers, Hoffman Estates, IL (US); Andrew Skipor, Glendale Heights, IL (US); Daniel Gamota, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 50 days.

(21) Appl. No.: 09/819,393

(22) Filed: Mar. 28, 2001

(65) Prior Publication Data

US 2002/0142514 A1 Oct. 3, 2002

(51) Int. Cl.[7] .......... H01L 21/44; H01L 21/48; H01L 21/50
(52) U.S. Cl. .......... 438/127; 438/106; 438/108; 438/126; 438/611; 438/612; 438/615
(58) Field of Search .......... 438/127, 106, 438/108, 126, 611, 612, 615

(56) References Cited

U.S. PATENT DOCUMENTS

| | | | | | |
|---|---|---|---|---|---|
| 5,289,346 A | * | 2/1994 | Carey et al. | ............ | 361/777 |
| 5,496,775 A | * | 3/1996 | Brooks | ............ | 438/127 |
| 5,547,730 A | * | 8/1996 | Weiblen et al. | ............ | 428/76 |
| 5,682,066 A | * | 10/1997 | Gamota et al. | ............ | 257/783 |
| 5,760,337 A | * | 6/1998 | Iyer et al. | ............ | 174/52.2 |
| 5,804,881 A | * | 9/1998 | Wille et al. | ............ | 257/780 |
| 5,821,456 A | * | 10/1998 | Wille et al. | ............ | 174/52.2 |
| 5,824,569 A | * | 10/1998 | Brooks et al. | ............ | 438/127 |
| 5,844,315 A | * | 12/1998 | Melton et al. | ............ | 257/738 |
| 5,844,319 A | * | 12/1998 | Gamota et al. | ............ | 257/778 |
| 5,895,229 A | * | 4/1999 | Carney et al. | ............ | 438/106 |
| 5,930,598 A | * | 7/1999 | Wille et al. | ............ | 438/108 |
| 6,034,333 A | * | 3/2000 | Skipor et al. | ............ | 174/260 |
| 6,046,910 A | * | 4/2000 | Ghaem et al. | ............ | 361/760 |
| 6,214,643 B1 | * | 4/2001 | Chiu | ............ | 438/108 |
| 6,214,650 B1 | * | 4/2001 | Nagerl et al. | ............ | 438/127 |
| 6,228,688 B1 | * | 5/2001 | Ohta et al. | ............ | 438/127 |
| 6,372,544 B1 | * | 4/2002 | Halderman et al. | ............ | 438/108 |
| 6,391,762 B1 | * | 5/2002 | Gamota et al. | ............ | 438/618 |

* cited by examiner

*Primary Examiner*—Matthew Smith
*Assistant Examiner*—Lex H. Malsawma
(74) *Attorney, Agent, or Firm*—Daniel K. Nichols

(57) ABSTRACT

A microelectronic assembly includes a substrate having a plurality of bond pads disposed on a substantially planar die attach surface and an integrated circuit die having a die face and a plurality of bond pads of the die face. The die is provided with a polymeric bead about the outer edges of the die. Die face bond pads are aligned with corresponding substrate bond pads and electrically interconnected by heating to a reflow temperature. Exposure of the polymeric bead to the reflow temperature causes the bead to form a peripheral bond between the die and the substrate.

10 Claims, 2 Drawing Sheets

MICROELECTRONIC ASSEMBLY WITH DIE SUPPORT AND METHOD

FIELD OF THE INVENTION

The present invention relates generally to microelectronic assemblies having an integrated circuit die attached to a substrate by a plurality of solder connections, and more specifically relates to a microelectronic assembly having a bead of polymeric material disposed about the periphery of the integrated circuit die. The bead of polymeric material connects the die to the substrate and operates to reduce breakage of the die and electrical connections.

BACKGROUND OF INVENTION

Many microelectronic assemblies are manufactured using the well-known flip chip on board (FCOB) technique. In FCOB assembly, an integrated circuit die is provided which includes a plurality of bond pads, with each of the bond pads having deposited thereon a solder bump. The die is turned over or flipped and is superimposed over a substrate having a plurality of bond pads, such that each of the solder bumps is aligned with a corresponding one of the bond pads on the substrate. The die and the substrate are then reflow-soldered together to form solder connections. The gap that remains between the downwardly facing die face and the upwardly facing substrate face is then filled using any one of a number of known underfill materials.

The underfill material, which typically contains silica or other particulates in a resin binder, serves to encapsulate the solder connections and serves to bond the die to the substrate. The underfill also increases the reliability of the microelectronic assembly during thermal cycling by enhancing the mechanical connection between the die and the substrate thereby mitigating the effects of thermal expansion problems.

Failure of integrated circuit dies from bending stresses, vibration stresses and stresses due to thermal expansion occurs most often at or near the die edges. Semiconductor dies are formed of an inflexible material that does not bend easily or resist multiple bending cycles. When mounted on a circuit board, a die will tend to break most often near the edge of the device when the board is flexed. The circuit board of hand-held devices may flex frequently from activation of buttons and rough handling during manufacturing and operation. Since electrical connections between the die and the board are often located near or at the edge of the die, the outermost located connections themselves are particularly vulnerable to failing when subjected to bending loads.

One prior art method of applying an underfill material has been to simply apply the underfill material to the assembly after the reflow soldering has been completed. The underfill material is drawn into the gap between the die and the substrate by capillary action. The assembly is then placed in an oven for curing. Typically, a small radius of underfill material, referred to as a fillet, adheres between the substrate and the lower edge portions of the die. An alternate example of using an underfill material includes first attaching a die to a substrate, tilting the assembly and allowing underfill material to flow under the die by the force of gravity. In both examples, since the epoxy becomes located for the most part underneath the body of the die, the peripheral edges or portions of the die are left relatively unsupported and vulnerable to stress.

A different method of bonding a semiconductor chip to a substrate uses a vacuum chamber to evacuate the gap between the chip and the substrate. A polymeric underfill material is forced into the gap when air is allowed to re-enter the chamber.

A technique of producing a die with high resistance to stress is obtained by providing a die within a package that also includes a base plate and cap. The die is adhesively attached to the base plate and a cap is affixed to the base plate such that an air gap is formed between the die and the cap. The base plate and die assembly is mounted to a substrate, such as a circuit board. The base plate tends to absorb stresses preferentially.

The methods described above do, to some extent, decrease the possibility of die and interconnect breakage due to stress by providing different means to support the die. However, these methods require additional manufacturing steps, materials and equipment. In some cases, encapsulating the die may itself exert stresses on the die, may be disadvantageous to marking techniques and may decrease the effective operating life of the die by reducing the capacity of the die to dissipate heat.

Accordingly, it would be desirable to provide a means of reducing die breakage that overcomes the disadvantages described above.

DETAILED DESCRIPTION OF THE PRESENTLY PREFERRED EMBODIMENTS

The following descriptions of the presently preferred embodiments are not intended to limit the scope of the invention to the precise forms disclosed, but instead are intended to be illustrative of the principles of the invention so that others may follow its teachings.

Figure 1:
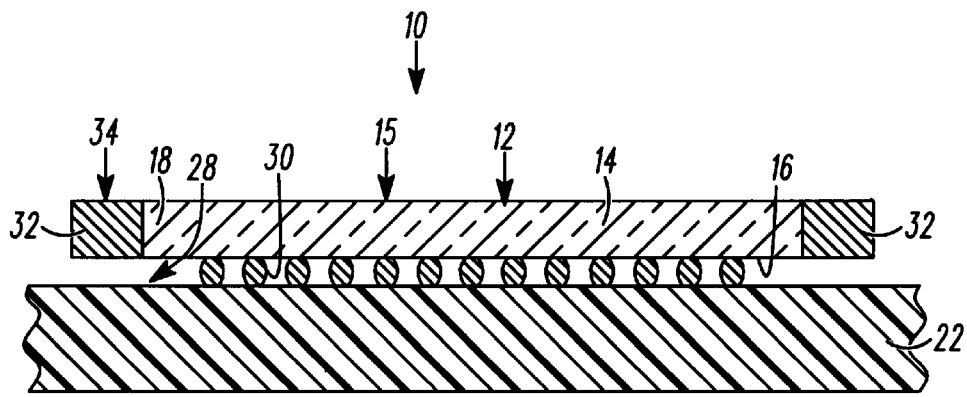
FIG. 1 is a cross-sectional view of a microelectronic assembly constructed in accordance with the teachings of an embodiment of the present invention.

FIG. 1 illustrates a cross-sectional view of a microelectronic assembly constructed in accordance with the teachings of an embodiment of the present invention. The microelectronic assembly 10 includes an integrated circuit die 12 of the type generally well known in the art. The die 12 includes a die body 14, a die face 16, and a plurality of lateral edge portions 18. The die 12 has circuitry formed thereon (not shown) as is well known, and also includes a plurality of bond pads (not shown) both disposed on the die face 16 with solder bumps 30 formed thereon. The die 12 is typically mass produced from a silicon wafer (not shown) which has formed thereon a plurality of integrated circuit dies which are diced, sawn, separated or otherwise singulated into one or more dies 12 as is well known in the art.

A substrate 22, such as a printed wiring board of the type commonly employed in the art and having circuitry (not shown) defined thereon, includes a substantially planar die attach surface 24. The substrate may be formed of standard substrate materials including ceramic, epoxy board, paper/epoxy/glass laminates, composites, flex, polyimide, polyester, and FEP (Teflon) materials and may include a stiffener layer of copper, aluminum, or an alloy material. Pluralities of bond pads (not shown) are spaced about the die attach surface 24. It should be understood that the bond pads on the die and the bond pads on the surface 24 of the substrate 22 are designed to line up or index to each other to provide electrical connection therebetween.

It will also be noted that when the die 12 is aligned over the substrate 22, a gap 28 is formed between the die attach surface 24 of the substrate 22 and the face 16 of the die 12. As is known in the art, solder connections are typically formed from solder bumps 30 which are deposited on either each of the bond pads of the die 12 or on each of the bond pads of the substrate 22 prior to assembly of the microelectronic assembly 10. The solder connections are formed from the solder bumps 30 after the die 12 is positioned over the substrate 22 and properly aligned, typically by using the reflow soldering method as is known.

In accordance with this invention, a polymeric bead 32 is disposed about the periphery of the outer edges of the die. A number of precursor materials are suitable for use in forming the polymeric bead. The bead 32 materials may consist of an epoxy prepolymer, which hardens in the presence of heat, i.e. a thermoset. The polymeric precursor material may consist of 60–80% by weight of a prepolymer (typically an epoxy prepolymer), 20–40% by weight of a hardener, 0.1–1.0% by weight of a catalyst, and 0.01–0.10% by weight of an adhesion promoter. The material may further include a range of filler between about 25% to about 75% by weight of particulate fillers, typically silica. Epoxy formulations typically include a hardener that reacts with the precursor to form the product resin. A suitable hardener is an amine-terminated polyether compound, preferably triethyleneglycol diamine. Alternatively the hardener may contain in its molecular structure two or more 2,5-dialkyl substituted furan group or two or more dienophiles (alkynes having electron withdrawing groups attached to both sides of the ethyne moiety e.g. ester and keto groups). Other suitable hardeners are isocyanates, melamines, aziridines, and anhydrides.

A catalyst is typically added to promote reaction of the constituents during curing. A preferred catalyst is 2-phenylimidazole. Other suitable catalysts are amines, acids and anhydrides.

The adhesion promoter is an aminosilane that enhances wetting of the substrate to promote adhesion of the resultant encapsulant. A preferred adhesion promoter is gamma-aminopropyltriethoxysilane. Other suitable adhesion promoters are fluoropolymers and silicones.

Such a thermoset material is preferably partially curable to a B stage polymer to form an essentially non-flowing bead 32 (i.e., a bead exhibiting some shear strength). The thermoset material is preferably fully curable at reflow temperatures to form the bead. The fully cured material is known as having been C staged.

Alternatively, the polymer precursor may contain moieties of a 2,5-dialkyl substituted furan instead of epoxy end groups. Such a polymer precursor material is available from Shell®, a more complete description of which may be found in U.S. Pat. No. 5,760,337 issued to Iyer and assigned to Shell®. In another embodiment of the invention, the bead 32 includes a thermoplastic polymer, such as a phenoxy resin. One such commercially available phenoxy resin is Paphen manufactured by Phenoxy Associates. Other suitable thermoplastic materials, which soften in the presence of heat, may be employed as long as such thermoplastics exhibit a softening point below the melting point of the solder material. It should be understood that the while the bead 32 appears to be shown as two elements, the present embodiment preferably contemplates that the bead is in the form of a substantially continuous bead, buttress, skirt or the like which is attached to the outer or peripheral edges of the die 12 and also attached to the surface 24 of the substrate 22. However, in alternate embodiments the bead 32 may be formed on less than all the outer edges of the die. In this manner, the microelectronic assembly may be used in applications where space is limited or less structural support is needed, for example. In the illustrated embodiment, the bead has a rectangular or square cross-section. Other cross-sections are also contemplated, such as round and oval cross-sections. Preferably, the bead 32 attaches to most, or all, of the edge surface 18 of the die 12 portion of the assembly 10. Attaching the bead 32 to a major portion of the edge surface 18 functions to support the edge of the die 12, and operates to absorb stresses which otherwise would be experienced directly by the die or the interconnect. Further, in the present embodiment, the exposed surface 34 of the bead is substantially coplanar with the die back surface 15.

Figure 2:
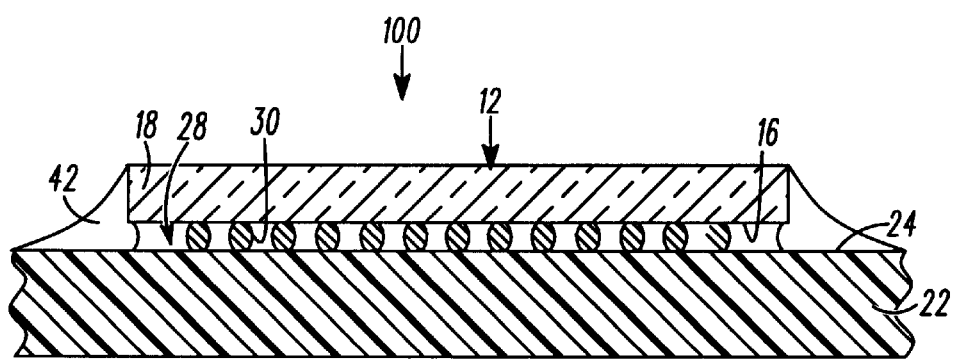
FIG. 2 is a cross-sectional view of a microelectronic assembly of another embodiment of the present invention.

FIG. 2 illustrates a cross-sectional view of a microelectronic assembly constructed in accordance with the teachings of another embodiment of the present invention. In FIG. 2, the elements of the invention shared with the embodiment shown in FIG. 1 have the same reference characters. The microelectronic assembly 100 has generally the same features as that shown in FIG. 1 with the exception of the bead 42. Bead 42 differs from bead 32 (see FIG. 1) in that the bead material also fills gap 28. In other words, the bead 42 not only surrounds the die 12, but also fills the gap 28 between the die 12 and the substrate 22. Thereby, the assembly 100 includes both bead material about the outer edges 18 of the die 12 and bead material in the gap 28 of the assembly 100.

Figure 3:
FIG. 3 is a side view of a semiconductor wafer positioned on a sheet of adhesive backing material.

With reference to FIGS. 3–7, a method of forming the microelectronic assembly of the present invention is illustrated. As shown in FIG. 3, a semiconductor wafer 202 formed by standard methods is placed on an adhesive backing material 204. The wafer 202 is positioned with the active surface 216 facing outwardly such that the active surface 216 and the bond pads (not shown) formed thereon are in an exposed condition. In the present embodiment, solder bumps 230 are formed on the bond pads on the active surface 216 of the wafer 202 using well-known methods.

Figure 4:
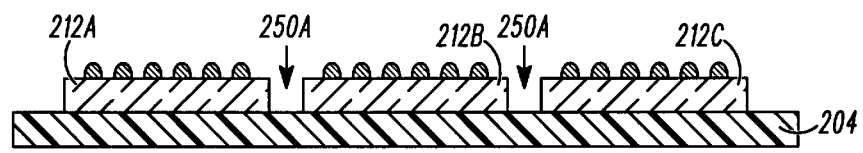
FIG. 4 is a side view of the wafer on the backing material as shown in FIG. 3 after the wafer has been separated into individual die.
Figure 5:
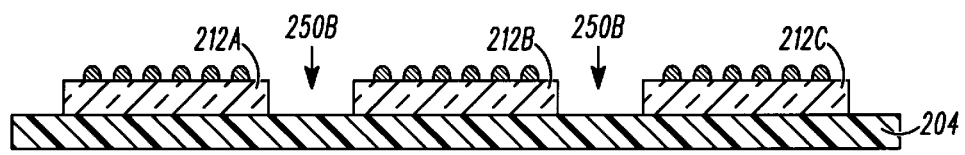
FIG. 5 is a side view of the dies and backing material of FIG. 4 with enlarged streets.
Figure 6:
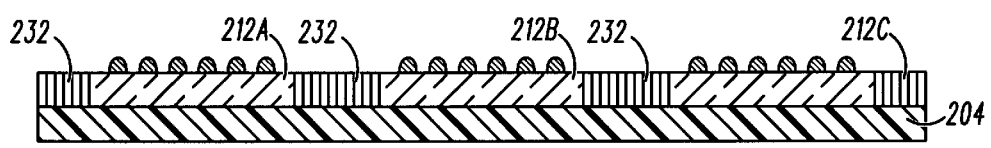
FIG. 6 is a side view of the dies and backing material of FIG. 5 with the streets filled with a polymeric precursor material.
Figure 7:
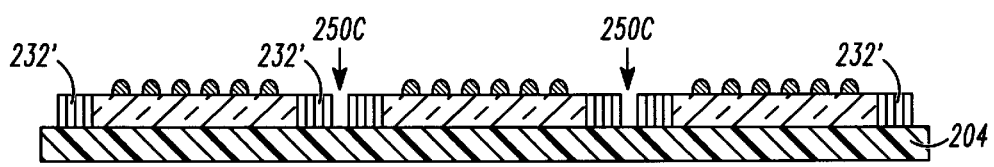
FIG. 7 is a side view of dies and backing material as shown in FIG. 6 after being re-separated into individual die with a bead of polymeric material located at the outer edges of each die.

As shown in FIG. 4, the wafer is separated into a plurality of individual dies 212A, 212B, 212C using known methods. A preferred method of dicing the wafer is sawing. Typically, semiconductor wafers include a number of integrated circuits arranged in rows and columns with the periphery of each integrated circuit or die being rectangular. Typically, the wafer is sawn or "diced" into rectangular shaped discrete dies along two mutually perpendicular sets of parallel lines or streets 250A lying between each of the rows and columns thereof. Hence, the separated or singulated integrated circuits are commonly referred to as dice or die.

The lanes between the die are referred to as streets. In one embodiment, stretching the backing material 204 expands the streets 250B (see FIG. 5). The expanded streets 250B are filled with a polymeric precursor material 232 (see FIG. 6). After filling the expanded streets 250B with the polymeric precursor material 232, the diced wafer 212A, 212B, 212C, polymeric precursor material 232 and backing are preferably heated to partially cure or B stage the material. If a thermosetting material is used, it is allowed to cool or set up. The streets 250C are re-sawn which re-separate the individual die 212A, 212B, 212C (see FIG. 7).

The die is selected, scanned for alignment, and superimposed over the substrate. With each solder bump in alignment with a corresponding bond pad, the die may be then tacked to the substrate using a vaporizable flux having a tacking agent. The subassembly is then heated to reflow in an oven (i.e., at least to the liquidus point of the solder material). It is noted that the bumps 230 can be formed on the substrate or on both the substrate and die.

Using known assembly techniques, at reflow temperature the solder bumps, aided by the fluxing agents form the solder connections. The bead flows, droops or expands in the presence of heat to contact and connect to the substrate. Exposure to the reflow temperature causes the bead to form a bond with the die and substrate. The reflow temperature also may cause the bead to become C staged or fully cured when the bead material includes a thermoset material.

The present invention may be embodied in other specific forms without departing from its spirit or essential characteristics. The described embodiments are to be considered in all respects only as illustrative and not restrictive.

We claim:

1. A method of forming a microelectronic assembly comprising:

providing a substrate having a plurality of bond pads;

providing an integrated circuit die component having at least one edge and a die face with a plurality of solder bumps disposed on the die face;

forming a bead on at least one outer edge of the die, the bead being made of a polymeric precursor material;

superimposing the die face over the substrate so that each solder bump contacts a corresponding one of the plurality of bond pads and wherein the die face is spaced apart from the substrate by a gap;

heating the die and the substrate to a temperature sufficient to reflow the solder bumps to form solder connections to corresponding bond pads, and to flow the polymeric precursor material onto the substrate.

2. The method of forming the microelectronic assembly of claim 1 wherein at least a portion of the polymeric precursor material is drawn into the gap to encapsulate the solder connection.

3. The method of forming the microelectronic assembly of claim 1 wherein the integrated circuit die component is a die with four edges, at least one of which has a bead formed thereon.

4. A method of forming a microelectronic assembly comprising:

providing a substrate having a plurality of bond pads;

providing an integrated circuit die component having at least one edge and a die face with a plurality of solder bumps disposed on the die face;

applying a bead on at least one edge of the die, the bead being made of a polymeric precursor material adapted to flow at an elevated temperature;

superimposing the die face over the substrate so that each solder bump contacts a corresponding one of the plurality of bond pads and wherein the die face is spaced apart from the substrate by a gap;

heating the die and the substrate to a temperature sufficient to reflow the solder bumps to form connections to corresponding bond pads, and to concurrently cause the polymeric precursor material to flow into the gap and cure to form an encapsulant; wherein the encapsulant protects the connection between the bond pads and the solder bumps.

5. The method of forming the microelectronic assembly of claim 4 wherein the polymeric precursor material connects the die and the substrate during heating and subsequent cooling of the microelectronic assembly.

6. The method of forming the microelectronic assembly of claim 4 wherein the polymeric precursor material is cured during heating.

7. The method of forming the microelectronic assembly of claim 4 wherein the polymeric precursor material is partially cured before the die is superimposed over the substrate.

8. A method of forming a microelectronic assembly comprising the steps of:

providing a semiconductor wafer having a wafer face, the wafer face having at least one integrated circuit die component formed thereon, each die component including a die face, a plurality of solder bumps disposed on the die face and a plurality of edges;

placing the semiconductor wafer onto an adhesive backing material with the wafer face facing outwardly from the adhesive backing material;

forming streets around each of the die components;

filling the streets with a polymeric precursor material;

separating the die components, each of the die components including a bead formed of the polymeric precursor material, the bead located on at least one of the edges of each of the die components;

providing a substrate having a plurality of bond pads;

superimposing the die face over the substrate so that each solder bump contacts a corresponding one of the plurality of bond pads;

heating the die component and the substrate to a temperature sufficient to reflow the solder bumps to form solder connections to corresponding bond pads and to flow the polymeric precursor material onto the substrate.

9. The method of forming the microelectronic assembly of claim 8 wherein the polymeric precursor material is partially cured before the die components are separated.

10. The method of forming the microelectronic assembly of claim 8 wherein the polymeric precursor material is adapted to be cured at the solder reflow temperature.

* * * * *